(12) United States Patent
Nawashiro

(10) Patent No.: US 7,029,147 B2
(45) Date of Patent: Apr. 18, 2006

(54) LIGHT EMITTING APPARATUS

(75) Inventor: Mitsuhiro Nawashiro, Aichi-ken (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 122 days.

(21) Appl. No.: 10/773,273

(22) Filed: Feb. 9, 2004

(65) Prior Publication Data
US 2004/0170018 A1    Sep. 2, 2004

(30) Foreign Application Priority Data
Feb. 28, 2003    (JP) .............................. 2003-054776

(51) Int. Cl.
F21V 11/00    (2006.01)
(52) U.S. Cl. .................... 362/236; 362/237; 362/240
(58) Field of Classification Search ........ 362/244–245, 362/236–237, 240, 227; 257/98
See application file for complete search history.

(56) References Cited

U.S. PATENT DOCUMENTS 6,066,861 A * 5/2000 Hohn et al. .................. 257/99
6,576,930 B1 * 6/2003 Reeh et al. ................... 257/98

FOREIGN PATENT DOCUMENTS

JP    6-103802    4/1994
JP    9-102631    4/1997

* cited by examiner

Primary Examiner—Sandra O'Shea
Assistant Examiner—Robert May
(74) Attorney, Agent, or Firm—McGinn IP Law Group, PLLC

(57) ABSTRACT

A light emitting apparatus has: a plurality of surface mount device (SMD) type light emitting diode elements; a circuit board on which the plurality of SMD type light emitting diode elements are mounted; and a plurality of convex lenses each of which covers the light extraction side of corresponding one of the plurality of SMD type light emitting diode elements. The lens optical axis of at least one of the plurality of convex lenses does not coincide with an axis that passes through the center of corresponding one of the plurality of SMD type light emitting diode elements and is perpendicular to the circuit board.

10 Claims, 6 Drawing Sheets

LIGHT EMITTING APPARATUS

The present application is based on Japanese patent application No.2003-054776, the entire contents of which are incorporated herein by reference.

BACKGROUND OF THE INVENTION

1. Field of the Invention

This invention relates to a light emitting apparatus using a light emitting diode element. For example, a light emitting apparatus of the invention is used as illumination light source in vehicle.

2. Description of the Related Art

Surface mount device (SMD) type light emitting diode elements are widely used as a light source such as illumination unit with limited installation space. For example, Japanese patent application laid-open No.6-103802 discloses a vehicle high mount stop lamp that a plurality of SMD type light emitting diode elements are arranged linearly. In this example, lens is disposed to cover each light emitting diode element, and light emitted from the light emitting diode element is converged by the lens function to enhance the directivity of light. On the other hand, Japanese patent application laid-open No.9-102631 discloses a SMD type light emitting diode element used as optical communication module. Also in this case, lens is used to enhance the directivity of light.

The conventional light emitting apparatuses are designed such that the apex (center) of lens is located just over each light emitting diode element and the optical axis of lens coincides with the optical axis of corresponding light emitting diode element. Thus, light emitted from each light emitting diode element passes through the lens, offering circular light. When a plurality of light emitting diode elements are disposed close to each other in order to enlarge the illumination area or to enhance the illumination intensity, lights from the light emitting diode elements are overlapped partially and, therefore, unevenness in illumination intensity occurs. The unevenness in illumination intensity may be solved by using a reflector to promote the diffusion of light. However, since each light emitting diode element is needed to have individual reflector to equalize the illumination intensity of the entire illumination area, the apparatus composition will be complicated and cannot meet a requirement to reduce its size. Even when using the reflector, it is difficult to obtain equalized illumination intensity in the entire illumination area.

Further, in the conventional light emitting apparatuses, one lens (or lens section) is disposed corresponding to one light emitting diode element. Namely, light emitted from one light emitting diode element is radiated outside through corresponding lens. Therefore, the light emitting diode elements have to be at a sufficient distance from each other in order not to generate interference between neighboring lenses. This becomes a restriction in reducing the size.

SUMMARY OF THE INVENTION

It is an object of the invention to provide a light emitting apparatus that offers equalized illumination intensity in the entire illumination area while having a simple composition and reduced size.

According to first aspect of the invention, a light emitting apparatus comprises:

a plurality of surface mount device type light emitting diode elements;

a circuit board on which the plurality of surface mount device type light emitting diode elements are mounted; and a plurality of convex lenses each of which covers the light extraction side of corresponding one of the plurality of surface mount device type light emitting diode elements;

wherein the lens optical axis of at least one of the plurality of convex lenses does not coincide with an axis that passes through the center of corresponding one of the plurality of surface mount device type light emitting diode elements and is perpendicular to the circuit board.

According to second aspect of the invention, a light emitting apparatus comprises:

a plurality of surface mount device type light emitting diode elements;

a circuit board on which the plurality of surface mount device type light emitting diode elements are mounted; and a plurality of convex lenses each of which covers the light extraction side of corresponding one of the plurality of surface mount device type light emitting diode elements;

wherein: lines to connect between centers of the plurality of surface mount device type light emitting diode elements define a virtual convex polygon; the lens apex of at least one of the plurality of convex lenses is located further than the position just over the corresponding light emitting diode element when viewing from the gravity point of the virtual convex polygon; and the lens optical axis is located on a plane that is defined by the optical axis of corresponding light emitting diode element and a straight line perpendicular to the circuit board and passing through the gravity point of the virtual convex polygon, and intersects with the straight line.

According to third aspect of the invention, a light emitting apparatus comprises:

a plurality of surface mount device type light emitting diode elements;

a circuit board on which the plurality of surface mount device type light emitting diode elements are mounted; and a plurality of convex lenses each of which covers the light extraction side of corresponding one of the plurality of surface mount device type light emitting diode elements;

wherein: lines to connect between centers of the plurality of surface mount device type light emitting diode elements define a virtual convex polygon; the lens apex of the plurality of convex lenses is located further than the position just over the corresponding light emitting diode element when viewing from the gravity point of the virtual convex polygon; and the lens optical axis is not parallel to a straight line perpendicular to the circuit board and passing through the gravity point of the virtual convex polygon.

In the invention, lens optical axis of part (or entire) of lens does not intersect vertically with the surface of circuit board. In other words, the lens optical axis is inclined to the optical axis of SMD type light emitting diode element and the radiation mode of light produced through the lens varies according to the inclination of lens optical axis. Thereby, the interference between light radiated through one lens and light radiated through the other neighboring lens can be adjusted to reduce the unevenness in illumination intensity. Further, since the interference of lights radiated through neighboring lens can be adjusted, the distance between neighboring light emitting diode elements can be reduced. Therefore, the apparatus size can be reduced.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Figure 1:
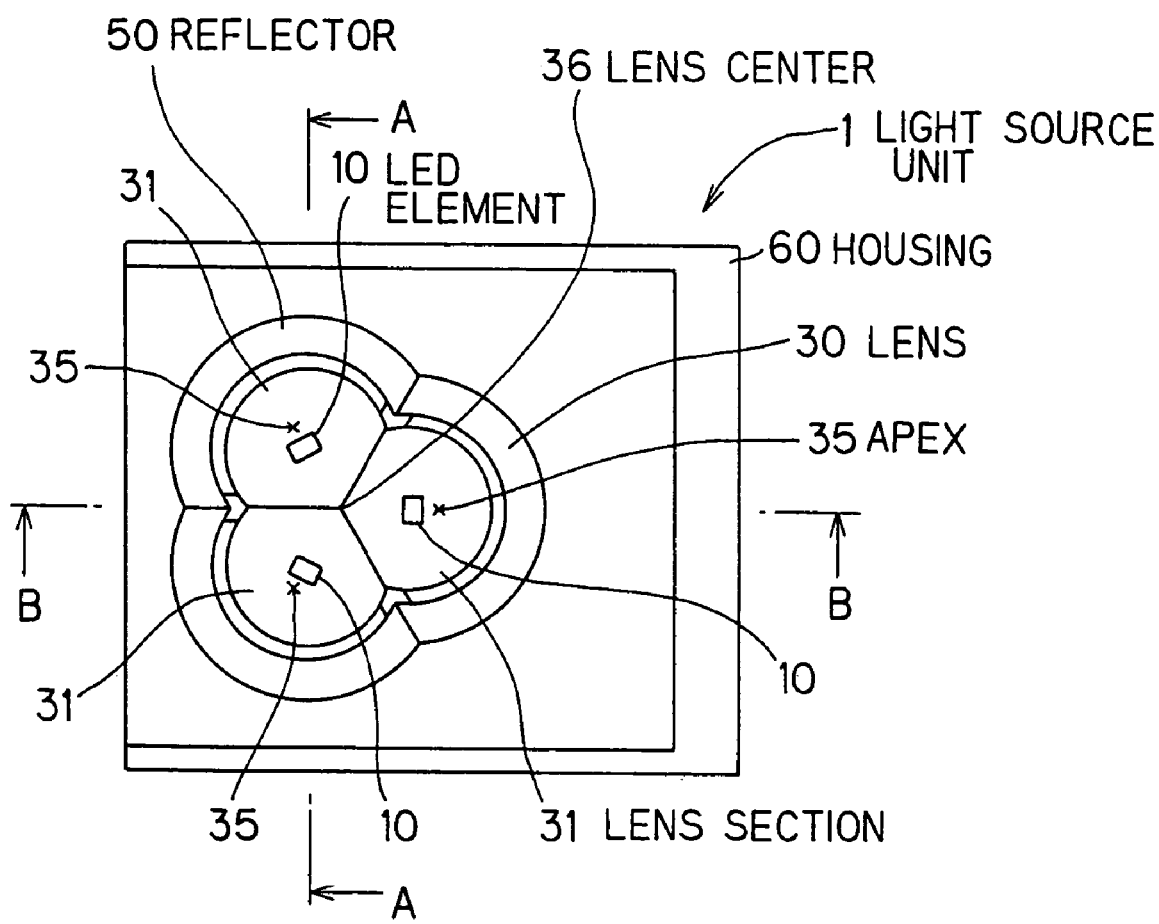
FIG. 1 is a top view showing a light source unit 1 in a preferred embodiment according to the invention.

A light emitting apparatus of the invention uses a plurality of SMD type light emitting diode elements. Herein, "light emitting diode element" means a SMD type light emitting diode element unless there is a specific definition.

In the light emitting diode element, a light emitting diode (light emitting diode chip) to emit light with color (e.g., blue, red and green) is installed. The light emitting diode element may include a plurality of light emitting diodes. In this case, same kind of light emitting diodes or different kind of light emitting diodes may be included therein. For example, light emitting diode elements can be used that generate white light, multiple colors, or full color by combining light emitting diodes to emit light's three primary colors, red, green and blue.

A light emitting diode element for white emission may be composed such that white light is generated by mixing light from a light emitting diode with light from a phosphor to be excited thereby. Such a light emitting diode element is composed of a light emitting diode with blue system emission light and a phosphor to generate yellow to yellow-green system fluorescence when receiving light from the light emitting diode. The phosphor used to convert the emission color may be included in the light emitting diode element, in lens described later or in a color conversion layer (e.g., between light emitting diode element and lens) to be additionally provided.

The kind of phosphor is not specifically limited and may be organic system or inorganic system. With organic phosphors, illumination light with clear feeling can be obtained. With inorganic phosphors, illumination light with delustering feeling can be obtained. Phosphors with various fluorescent colors can be used. For example, available are phosphors with light's three primary colors, red, green and blue, and phosphors with neutral colors thereof. A plurality of phosphors may be used in combination. For example, a mixture of red system phosphor, green system phosphor and blue system phosphor can be used.

The number of light emitting diode elements to be used is determined considering the size of illumination area, brightness etc. required. In case of light emitting apparatus used for relatively small illumination area, three to six light emitting diode elements may be used.

It is preferable that the light emitting diode elements are disposed on the circuit board to allow lines to connect between the centers of light emitting diode elements to define a virtual convex polygon (triangle, quadrangle, pentagon, hexagon etc.). With such a deposition manner, light emitting sources (light emitting diode elements) continuously exist surrounding a predetermined area to allow the equalization of illumination intensity. It is more desirable to employ such a deposition manner that allows lines to connect between the centers of light emitting diode elements to define a virtual regular polygon (regular triangle, regular quadrangle, regular pentagon, regular hexagon etc.). Because, with the light emitting sources disposed at equal intervals, the equalization of illumination intensity can be further ensured. A most preferable example in deposition manner of light emitting diode elements is that three light emitting diode elements each are disposed at the apexes of virtual regular triangle. In such a deposition manner, the number of light emitting diode elements used can be reduced and the number of lens sections described later used can be concomitantly reduced. Therefore, the light emitting apparatus can be highly simplified in composition. Accordingly, the deposition of light emitting diode element and the designing of lens can be easily conducted in equalizing the illumination intensity.

The light emitting diode elements are mounted on the circuit board. The circuit board has a conductive pattern corresponding to circuit composition on its front and back surfaces. The material of conductive pattern is not specifically limited if good conductivity is secured. For example, it may be copper (Cu), tungsten (W), molybdenum (Mo) or silver (Ag). The material of substrate may be a resin such as polyimide, bismaleimide triazine resin and glass epoxy, ceramics etc.

The circuit board may be provided with various elements such as resistance and capacitor other than light emitting diode element, when needed.

A convex lens is disposed to cover the light extraction side of light emitting diode element. The convex lens each are disposed corresponding to the light emitting diode elements, and most of light radiated from the light emitting diode element is taken out through the corresponding convex lens. The surface of convex lens may be formed spherical, elliptical, parabolic etc.

The position of the convex lens is determined, though it depends on the position of light emitting diode elements, in consideration of illumination mode of the entire apparatus. In the light emitting apparatus of the invention, at least one lens has such a lens optical axis (i.e., straight line axis passing through the lens apex (lens center) and lens focal point) that does not coincide with an axis penetrating through the center of corresponding light emitting diode element and perpendicular to the circuit board. Namely, the lens optical axis is inclined to the optical axis of corresponding light emitting diode element. Thereby, the radiation mode of light through that lens varies according to the inclination of lens optical axis. As a result, the interference between thus varied light and light through the other neighboring lens can be adjusted to reduce the unevenness in illumination intensity.

In one example, the lens is deposited such that, given that lines to connect between the centers of light emitting diode elements define a virtual convex polygon, (1) the lens apex is located further than the position just over the corresponding light emitting diode element when viewing from the gravity point of the virtual convex polygon, and (2) the lens optical axis is located on a plane that is defined by the optical axis of corresponding light emitting diode element and straight line (hereinafter referred to as reference perpendicular) perpendicular to the circuit board and passing through the gravity point of the virtual convex polygon, and intersects with the reference perpendicular. It is preferable that all lenses are deposited in like manner. This is because light radiated through each lens can be prevented from converging on the center of illumination area, thereby unevenness in illumination intensity between the center and circumference of illumination area can be reduced to equalize the illumination intensity in the entire illumination area. In this deposition example, the lens optical axis intersects with the reference perpendicular at a predetermined angle. The intersecting angle can be determined in consideration of the distance between lens and its corresponding light emitting diode element, the dimensions of lens, the size of illumination area etc. For example, it is 3° to 35° and preferably 8° to 25°.

The inclination of lens is preferably adjusted such that the optical axes of lenses intersect with each other at one point on the reference perpendicular. In this composition, illumination light with uniformity can be obtained around the reference perpendicular. Especially when the light emitting diode elements each are deposited at the apex positions of virtual regular polygon, the uniformity of illumination intensity can be further enhanced, thereby nearly circular light can be obtained that is generally assumed desirable for illumination light.

In another example, the lens is deposited such that, given that lines to connect between the centers of light emitting diode elements define a virtual convex polygon, (1) the lens apex is not located just over the corresponding light emitting diode element and is located away from the gravity point of the virtual convex polygon, and (2) the lens optical axis is not parallel to a straight line (reference perpendicular) perpendicular to the circuit board and passing through the gravity point of the virtual convex polygon.

Although the lens may be composed of separated lenses, it is preferable that all separated lenses are integrally constructed. Namely, it is preferable that neighboring lenses are bonded to each other. This lens composition can be assumed such that a lens provided with a plurality of lens sections (each lens section corresponding to each light emitting diode element) is used.

In each lens section, a surface (i.e., surface to which light emitted from light emitting diode element is entered) on the side of corresponding light emitting diode element is formed convex. Namely, double-convex lens may be used. In this composition, light emitted from the light emitting diode element is once converged when introduced into the lens and, thereby, radiation light with further controlled directivity can be obtained. In case of using double-convex lens, it is preferable that the lens axes of upper and lower lenses coincide with each other. This is because the light radiation mode can be easily controlled by lens.

The lens may be of synthetic resin such as polycarbonate, acrylic resin and epoxy resin or inorganic material such as glass.

The light emitting apparatus of the invention is preferably provided with a reflector (reflection member). The reflector is used to reflect part of light emitted from the light emitting diode element and to guide it to the light extraction direction. Thus, the emission efficiency can be enhanced by using the reflector. It is preferable that the reflector is disposed to surround the integrated lenses unit. This is because the reflector can be simplified in composition and the entire light emitting apparatus can be simplified in composition.

The reflector may be made by molding resin including reflective filler or metal. The reflection efficiency can be enhanced by making plating layer on the surface of reflector.

An example in the preferred embodiment of the invention will be explained below.

EXAMPLE

Figure 2:
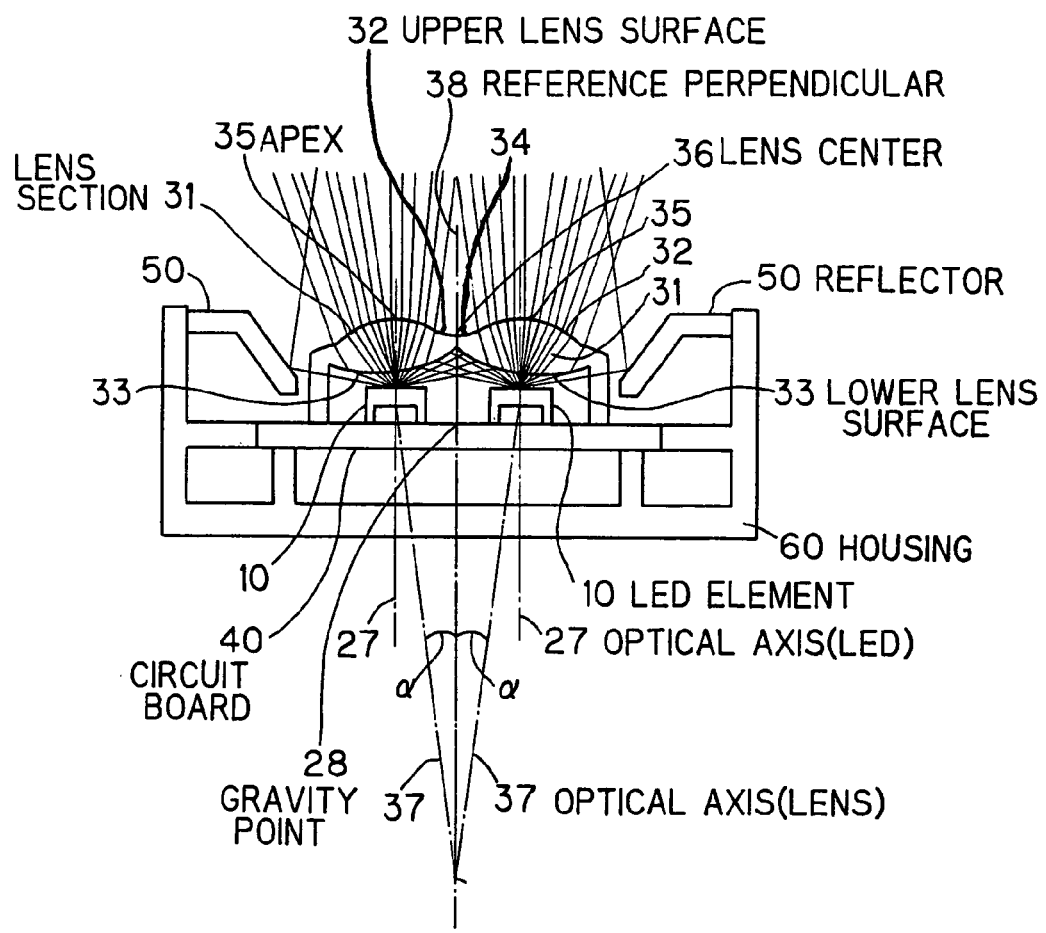
FIG. 2 is a cross sectional view cut along the line A—A in FIG. 1.
Figure 3:
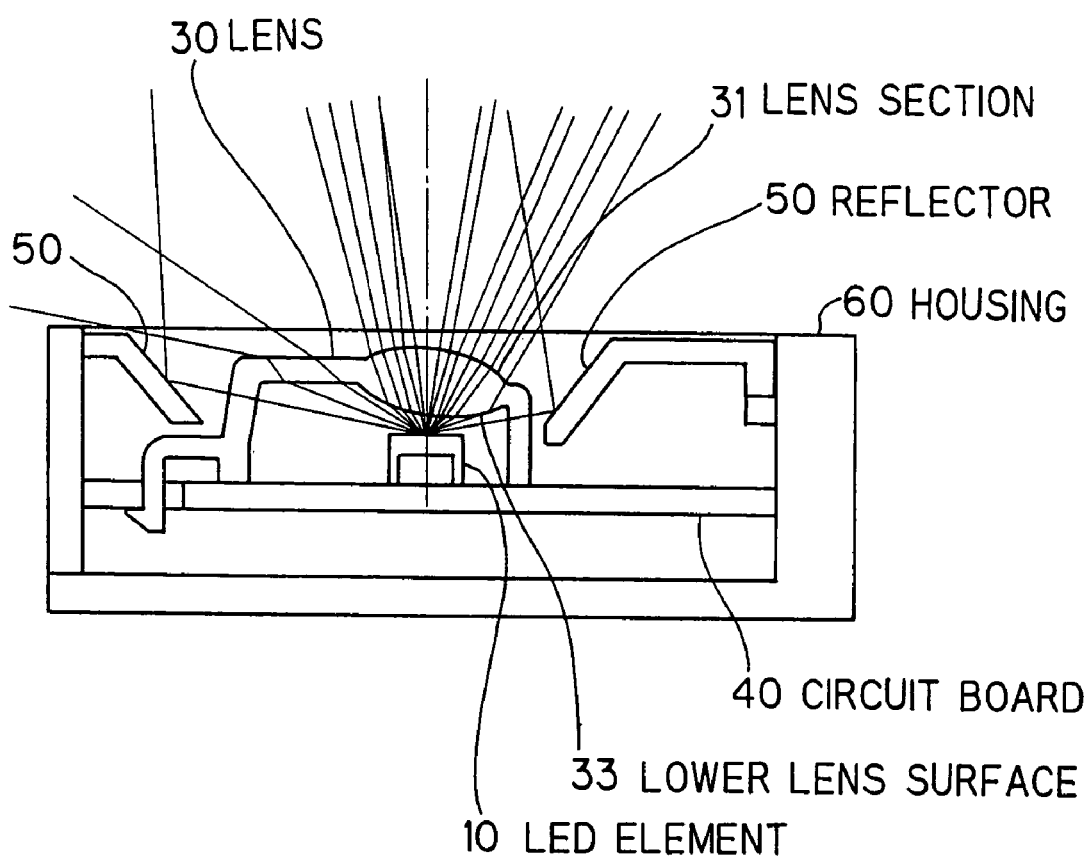
FIG. 3 is a cross sectional view cut along the line B—B in FIG. 1.
Figure 4:
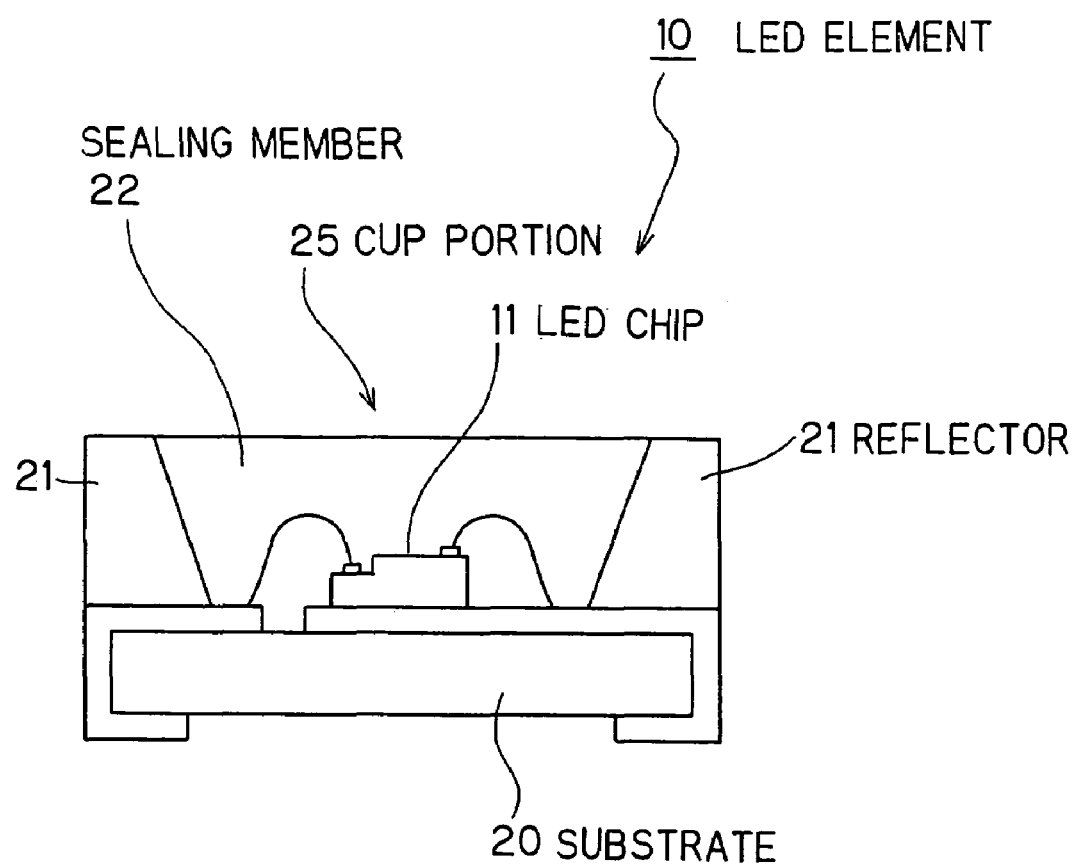
FIG. 4 is a schematic cross sectional view showing an LED element 10 used in the light source unit 1.

FIG. 1 is a top view showing a light source unit 1 in the preferred embodiment according to the invention. FIG. 2 is a cross sectional view cut along the line A—A in FIG. 1. FIG. 3 is a cross sectional view cut along the line B—B in FIG. 1. FIG. 4 is a schematic cross sectional view showing an LED element 10 used in the light source unit 1.

The light source 1 is composed of: a housing 60; surface mounted type light emitting diode elements 10 (hereinafter referred to as LED element); a lens 30; a circuit board 40; and a reflector 50. The LED element 10 is composed of an LED chip 11, a substrate 20, a reflector 21 and a sealing member 22 (See FIG. 4). Meanwhile, the LED element 10 includes a Zener diode (not shown) for anti-electrostatic.

Figure 5:
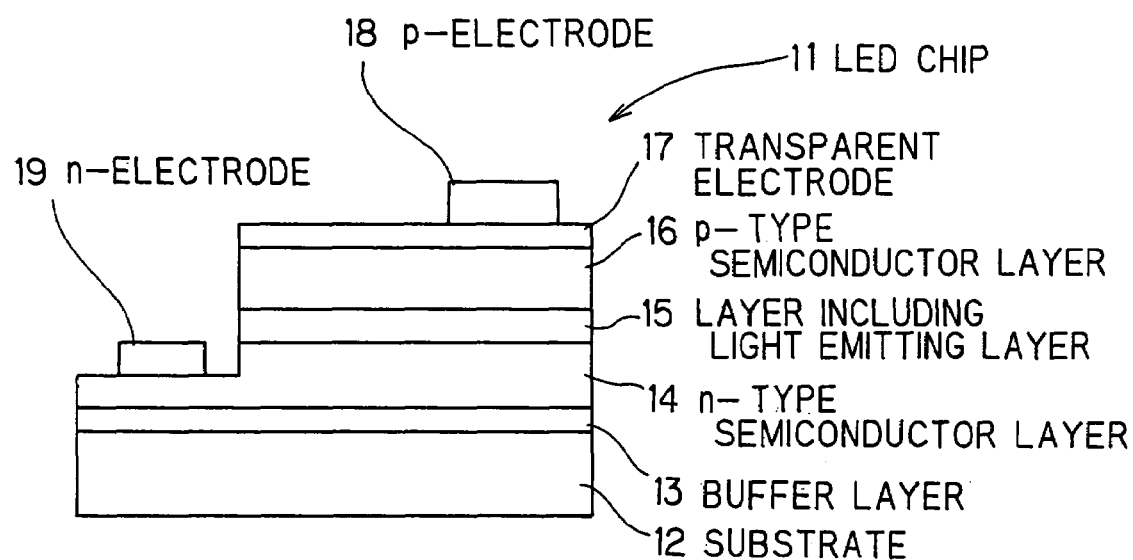
FIG. 5 is a schematic cross sectional view showing the LED chip 11 used in the LED element 10.

FIG. 5 is a schematic cross sectional view showing the LED chip 11 used in the LED element 10. As shown, the LED chip 11 is composed of a sapphire substrate 12 and a plurality of layers formed on the sapphire substrate 12. It has a main emission peak wavelength of around 480 nm. The details of LED chip 11 are as follows:

| Layers | Composition |
|---|---|
| p-type layer 16 | p-GaN: Mg |
| layer 15 including light emitting layer | InGaN layer included |
| n-type layer 14 | n-GaN:Si |
| buffer layer 13 | AlN |
| substrate 12 | sapphire | n-type layer 14 of GaN with n-type impurity Si doped is grown through buffer layer 13 on the substrate 12. Although the substrate 12 is of sapphire in this embodiment, it may be, instead, of spinel, silicon carbide, zinc oxide, magnesium oxide, manganese oxide, zirconium boride or III group nitride system compound semiconductor single crystal etc. The buffer layer 13 of AlN is grown by MOCVD. It may be of GaN, InN, AlGaN, InGaN, AlGaInN etc. and may be grown by molecular beam epitaxy (MBE), hydride vapor phase epitaxy (HVPE), sputtering, ion plating, electron shower etc. When the substrate 12 is of III group nitride system compound semiconductor, the buffer layer can be omitted.

Meanwhile, the substrate and buffer layer can be removed after forming the semiconductor element, when needed.

Although n-type layer 14 is of GaN, it may be of AlGaN, InGaN or AlInGaN.

Although n-type impurity Si is doped in the n-type layer 14, the other n-type impurity, e.g. Ge, Se, Te and C may be doped therein.

The layer 15 including light emitting layer can have quantum well structure (multiquantum well structure or single quantum well structure). The structure of light emitting element may be of single-hetero type, double-hetero type or homo junction type.

The layer 15 including light emitting layer may also include Mg-doped III group nitride system compound semiconductor layer with a large bandgap on the p-type layer 16 side. This prevents electrons injected into the layer 15 including light emitting layer from dispersing into the p-type layer 16.

p-type layer 16 of GaN with p-type impurity Mg doped is grown on the layer 15 including light emitting layer. The p-type layer 16 may be of AlGaN, InGaN or AlInGaN. P-type impurity may be Zn, Be, Ca, Sr or Ba. After doping p-type impurity, the layer 16 can be treated by a known method such as electron beam radiation, annealing and plasma radiation to lower the resistivity, but this treatment is not needed necessarily.

In this embodiment, the III group nitride system compound semiconductor layer is grown, under general conditions, by MOCVD, molecular beam epitaxy (MBE), hydride vapor phase epitaxy (HVPE), sputtering, ion plating, electron shower etc.

n-type electrode 19 is composed of two layers of Al and V. After growing the p-type layer 16, part of the p-type layer 16, layer 15 including light emitting layer and n-type layer 14 is removed by etching, then forming the n-type electrode 19 on exposed n-type layer 14 by vapor deposition.

Transparent electrode 17 formed on the p-type layer 16 is thin film including gold. Also, p-type electrode 18 formed on the transparent electrode 17 by vapor deposition is of material including gold.

After forming the layers and electrodes as described above, the wafer is separated into chips.

Meanwhile, on the back surface (on the surface side with no semiconductor layer formed) of substrate 12, a reflection layer may be formed that is of Al, Ag, titanium nitride, hafnium nitride, zirconium nitride, tantalum nitride etc. With the reflection layer, light proceeding to the substrate 12 side can be efficiently reflected and converted, thereby enhancing the light extraction efficiency. Such a reflection layer can be formed by a known method such as deposition.

A reflector 21 is of white system resin and is molded such that its inner surface to form a cup portion 25 gives a desired angle to optical axis.

A sealing member 22 is embedded in the cup portion 25 to cover the LED chip 11. In this embodiment, the sealing member 22 is of epoxy resin with yellow system phosphor dispersed therein.

The light source unit 1 uses three LED elements 10 thus composed, and it is mounted to the substrate 20 such that lines to connect between the three LED elements define a virtual regular triangle (See FIG. 1).

The lens 30 is of transparent resin and it has three lens sections 31 bonded to one another. Each lens section 31 is a double-convex lens having upper and lower convex lenses. In this embodiment, the shape of upper lens surface 32 and lower lens surface 33 in each lens section 31 is elliptical. Meanwhile, the shape thereof is not limited to elliptical and may be spherical or parabolic.

The upper lens surface 32 of each lens section 31 has an apex 35 (center) that is not located just over the corresponding LED element 10 and is located away from the center 36 of lens 30 (See FIGS. 1, 2). Its optical axis 37 is located on a plane that is defined by optical axis 27 (i.e., a straight line axis perpendicular to the circuit board 40 and penetrating through the center of LED element 10) of corresponding LED element 10 and a line 38 (reference perpendicular) perpendicular to the circuit board 40 and penetrating through the gravity point 28 of virtual regular triangle defined connecting between the three LED elements 10. Further, the optical axis 37 of each lens intersects, at an angle (α) of around 8°, with the reference perpendicular 38 at a point 39 on the reference perpendicular 38. The reference perpendicular 38 penetrates through a lens center 36.

On the other hand, the shape and inclination angle of lower lens 33 of each lens section 31 is designed such that the lens optical axis of lower lens surface 33 coincides with the lens optical axis 37 of upper lens surface 32 as its counterpart. Thus, with the coincidence of optical axes of upper and lower lens surfaces, the lens function of upper and lower lens surfaces can be controlled easily. In this embodiment, the shape of lower lens surface 33 is elliptical like the upper lens surface 32 but is not limited to that.

In the lens 30, a region 34 where neighboring upper lens surfaces 32 are connected is made to have a flat surface. Such a lens surface is designed considering the emission mode of the entire light source unit 1. In this embodiment, by providing the flat surface, illumination light with equalized illumination intensity can be obtained. Instead of flat surface, concave or convex surface may be used to have different emission mode.

The emission mode of light source unit 1 is explained below with reference to FIG. 3. At first, when necessary power is supplied to the LED element 10, blue system light is emitted from the LED chip 11 in the LED element 10. Part of blue system light excites the phosphor when it passes through the sealing member in the LE element 10, and yellow system light is thereby generated. As a result, the LED element 10 emits white light obtained mixing blue system light with yellow system light. Most of white light emitted from the LED element 10 is introduced into the lens 30 through the back surface (lower lens surface 33) of corresponding lens section 31. Light to be introduced through the lower lens surface 33 is converged while being introduced. Thereby, the introduced light can be efficiently guided to the upper lens surface 32. Thus, light introduced into the lens section 31 is radiated outside through the upper lens surface 32. At that time, the directivity can be enhanced by virtue of the lens function.

Further, since the upper lens surface 32 is inclined as described earlier, light to be radiated through the upper lens surface 32 is, in total, slightly inclined to outside from the center of light source unit 1, and the amount of light radiated toward its central region is thereby reduced. Therefore, the light source unit 1 can prevent light to be radiated through each lens section 31 from converging on the central region, and it allows equalized illumination intensity in the entire illumination area.

In addition, since the disposition mode of each LED element 10 and the composition of lens 30 are as described above, circular illumination light can be obtained. Thus, the light source unit 1 is suitable for illumination light source.

On the other hand, due to preventing light to be radiated through each lens section 31 from converging on the central region, each LED element 10 can be disposed closer to each other. Therefore, the light source unit 1 can be designed in reduced size.

Part of light radiated from each LED element 10 is introduced into the lens 30 through its back surface except for the lower lens surface 33. Part of introduced light is radiated outside through the flat surface formed in the boundary region 34 of lens sections 31. On the other hand, the other part is reflected on the reflector 50, and then converted in radiation direction. Thus, with the reflector 50, light radiated laterally can be efficiently used as illumination light, and the illumination intensity can be enhanced by that much. Meanwhile, part of light emitted from one LED element 10 is also radiated outside through the other lens section 31 than corresponding lens section 31.

As described above, the light source unit 1 can offer high-quality light with simple composition and can be significantly reduced in size. Therefore, it is suitable for a light source such as a map lamp and a foot lamp installed in a vehicle.

Although in this embodiment the light source unit 1 uses three LED elements 10 and three lens sections 31 composing the lens 30, the number of LED element and lens section is limited to that. For example, the light source unit 1 may be composed of four LED elements and each LED element may be disposed such that lines to connect between the four LED elements define a virtual square. Also in this case, similarly to the light source unit 1 aforementioned, lens with four lens sections may be used and each lens section may be inclined to outside from the lens center to prevent the convergence of light toward the central region.

Figure 6:
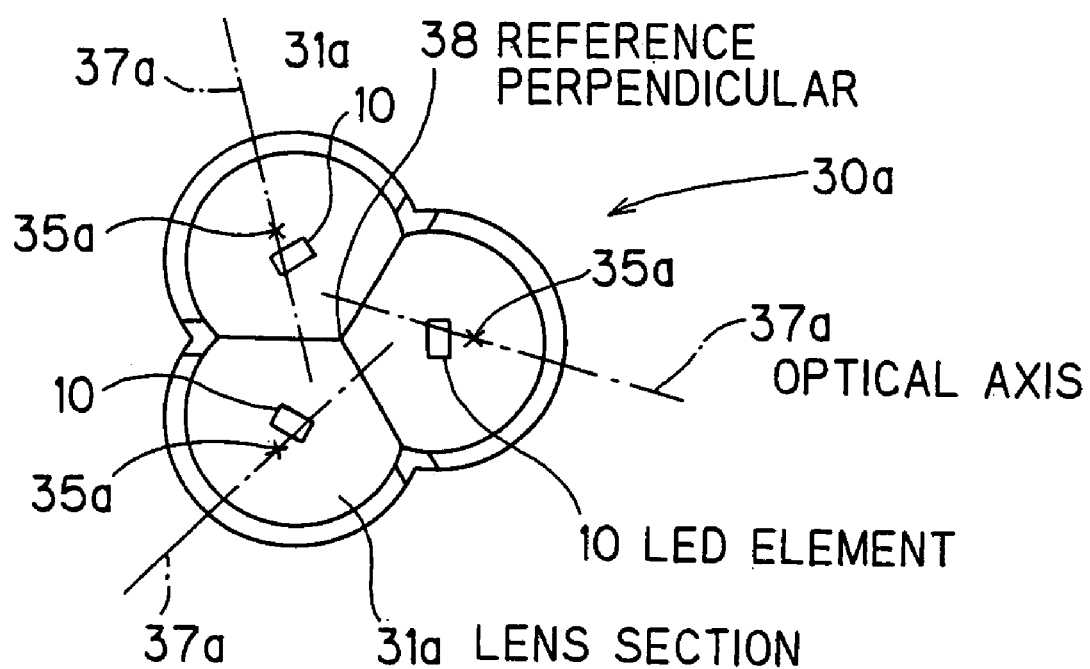
FIG. 6 is a top view showing an alternative lens available for the light source unit 1.

As mentioned above, the lens 30 used in the light source unit 1 is designed such that the optical axis 37 of each lens section 31 intersects with the reference perpendicular 38 at a predetermined angle. However, as shown in FIG. 6, lens 30a may be composed such that optical axis 37a of each lens section 31a does not intersect with (i.e., is parallel to) a reference perpendicular (a line perpendicular to the circuit board 40 and penetrating through the gravity point of a virtual regular triangle defined connecting between the three LED elements 10). In this case, the lens 30a is configured such that the optical axes 37a of lens sections 31a have rotational symmetry around the reference perpendicular. With the rotational symmetry, illumination light with reduced unevenness in illumination intensity can be obtained.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A light emitting apparatus, comprising:
    a plurality of surface mount device type light emitting diode elements;
    a circuit board on which the plurality of surface mount device type light emitting diode elements are mounted; and
    a plurality of convex lenses each of which covers the light extraction side of corresponding one of the plurality of surface mount device type light emitting diode elements;
    wherein the lens optical axis of at least one of the plurality of convex lenses does not coincide with an axis that passes through the center of corresponding one of the plurality of surface mount device type light emitting diode elements and is perpendicular to the circuit board.

2. The light emitting apparatus according to claim 1, wherein:
    the plurality of convex lenses are integrated in construction.

3. The light emitting apparatus according to claim 2, wherein:
    the plurality of convex lenses includes a common boundary region that has a flat surface on the light extraction side.

4. The light emitting apparatus according to claim 1, wherein:
    each of the plurality of convex lenses has a convex surface on the side of corresponding surface mount type light emitting diode element.

5. The light emitting apparatus according to claim 1, further comprising:
    a reflector that is disposed to surround the plurality of convex lenses.

6. A light emitting apparatus, comprising:
    a plurality of surface mount device type light emitting diode elements;
    a circuit board on which the plurality of surface mount device type light emitting diode elements are mounted; and
    a plurality of convex lenses each of which covers the light extraction side of corresponding one of the plurality of surface mount device type light emitting diode elements;
    wherein:
        lines to connect between centers of the plurality of surface mount device type light emitting diode elements define a virtual convex polygon;
        the lens apex of at least one of the plurality of convex lenses is located further than the position just over the corresponding light emitting diode element when viewing from the gravity point of the virtual convex polygon; and
        the lens optical axis is located on a plane that is defined by the optical axis of corresponding light emitting diode element and a straight line perpendicular to the circuit board and passing through the gravity point of the virtual convex polygon, and intersects with the straight line.

7. The light emitting apparatus according to claim 6, wherein:
    the optical axes of the plurality of convex lenses intersect with each other at one point on the straight line perpendicular to the circuit board and passing through the gravity point of the virtual convex polygon.

8. The light emitting apparatus according to claim 6, wherein:
    the virtual convex polygon is a regular polygon.

9. The light emitting apparatus according to claim 6, wherein:
    the virtual convex polygon is a regular triangle.

10. A light emitting apparatus, comprising:
    a plurality of surface mount device type light emitting diode elements;
    a circuit board on which the plurality of surface mount device type light emitting diode elements are mounted; and
    a plurality of convex lenses each of which covers the light extraction side of corresponding one of the plurality of surface mount device type light emitting diode elements;
    wherein:
        lines to connect between centers of the plurality of surface mount device type light emitting diode elements define a virtual convex polygon;
        the lens apex of the plurality of convex lenses is located further than the position just over the corresponding light emitting diode element when viewing from the gravity point of the virtual convex polygon; and
        the lens optical axis is not parallel to and intersects with a straight line perpendicular to the circuit board and passing through the gravity point of the virtual convex polygon.

* * * * *